United States Patent
Shim et al.

(10) Patent No.: US 7,551,107 B2
(45) Date of Patent: Jun. 23, 2009

(54) MULTIPLEXER FOR CONTROLLING DATA OUTPUT SEQUENCE AND PARALLEL-TO-SERIAL CONVERTER USING THE SAME

(75) Inventors: Jae Hoon Shim, Daejeon (KR); Cheon Soo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/932,993

(22) Filed: Oct. 31, 2007

(65) Prior Publication Data

US 2008/0129561 A1   Jun. 5, 2008

(30) Foreign Application Priority Data

Dec. 5, 2006  (KR) .................. 10-2006-0122559
Jun. 4, 2007  (KR) .................. 10-2007-0054593

(51) Int. Cl.
  *H03M 9/00* (2006.01)
(52) U.S. Cl. ...................... 341/101; 341/141
(58) Field of Classification Search .......... 341/101–155
  See application file for complete search history.

(56) References Cited

U.S. PATENT DOCUMENTS 6,222,380 B1   4/2001  Gerowitz et al.
6,611,217 B2 *  8/2003  Buchanan et al. .......... 341/100
7,429,871 B2 *  9/2008  Kim et al. .................. 326/30
2003/0048209 A1  3/2003  Buchanan et al.

FOREIGN PATENT DOCUMENTS

| JP | 06-311048 | 11/1994 |
| JP | 2004-135337 | 4/2004 |
| KR | 10-2003-0042213 | 5/2003 |
| KR | 10-2006-0071977 | 6/2006 |

OTHER PUBLICATIONS

"Silicon Bipolar Chipset for SONET/SDH 10 Gb/s Fiber-Optic Communication Links", L Ingmar Andersson et al., IEEE Journal Of Solid-State Circuits, vol. 30, No. 3, pp. 210-218, Mar. 1995.
"A 10-Gb/s 16:1 Multiplexer and 10-GHz Clock Synthesizer in 0.25-μm SiGe BiCMOS", Hong-Ih Cong et al., IEEE Journal Of Solid-State Circuits, vol. 36, No. 12, pp. 1946-1953, Dec. 2001.

* cited by examiner

*Primary Examiner*—Lam T Mai
(74) *Attorney, Agent, or Firm*—Rabin & Berdo, PC

(57) ABSTRACT

Provided are a multiplexer for controlling a data output sequence and a parallel-to-serial converter using the multiplexer. The multiplexer is configured to simply control the output sequence of input data in accordance with a value of a selection signal. The parallel-to-serial converter with the multiplexer can easily control an output bit sequence of serial data without altering an interconnection structure of parallel data signal lines.

13 Claims, 3 Drawing Sheets

US 7,551,107 B2

MULTIPLEXER FOR CONTROLLING DATA OUTPUT SEQUENCE AND PARALLEL-TO-SERIAL CONVERTER USING THE SAME

CROSS-REFERENCE TO RELATED APPLICATION

This application claims priority to and the benefit of Korean Patent Application Nos. 2006-122559, filed Dec. 5, 2006, and 2007-54593, filed Jun. 4, 2007, the disclosures of which are incorporated herein by reference in their entirety.

BACKGROUND

1. Field of the Invention

The present invention relates to multiplexers for controlling a data output sequence and parallel-to-serial converters using the same. More particularly, the present invention disclosed herein relates to technology for easily controlling a bit sequence of serial data output from a parallel-to-serial converter where a plurality of multiplexers are coupled each other in a tree structure, by simply controlling the output sequence of data output from the multiplexers without altering an interconnection structure thereof.

The present invention has been produced from the work supported by the IT R&D program of MIC (Ministry of Information and Communication)/IITA (Institute for Information Technology Advancement) [2005-S075-02, Development of SoC for Wired and Wireless Unified Network] in Korea.

2. Discussion of Related Art

A multiplexer is a kind of electronic circuit component that functions to select one input data signal from a plurality of input data signals and output the selected data signal. A data signal to be selected is determined by an input state of a selection signal. A multiplexer is generally abbreviated to MUX.

FIGS. 1A and 1B are circuit diagrams of conventional multiplexers.

Referring to FIG. 1A, a first input data bit D0 of a multiplexer 100 is latched in latches 110A, 110B, and 110C while a second input data bit D1 is latched in latches 120A and 120B.

The reason for latching the first and second input data bits in the latches 110A, 110B, 110C, 120A, and 120B is: (1) not to generate a glitch at an output Q, even when the two input data bits D0 and D1 vary at the same time; and (2) not to generate a glitch at the output Q, even when the two input data bits D0 and D1 vary at a certain time regardless of a clock signal CLK that is used as a control signal.

In the meantime, it is also possible to employ a multiplexer omitted one of the latches coupled to the input data bit D0 and another of the latches coupled to the input data bit D1, as shown in FIG. 1B, in order to reduce power consumption through the 2:1 multiplexer shown in FIG. 1A.

The 2:1 multiplexer configured as shown in FIGS. 1A and 1B can be employed in a parallel-to-serial converter for transforming parallel data into serial data. A conventional parallel-to-serial converter includes the 2:1 multiplexers coupled in a tree structure for fast operation.

However, as the 2:1 multiplexer is designed such that the first input data bit D0 passes through one more latch than the second input data bit D1 does (refer to FIGS. 1A and 1B), the second input data bit D1 is always output earlier than the first input data bit D0.

In other words, a parallel-to-serial converter with the conventional 2:1 multiplexers formed in a tree structure has a complicated circuit structure, in which it is inevitable that signal lines of parallel data intersect each other to change an output bit sequence, because the bit sequence is fixed when the parallel data is converted into serial data. Furthermore, the complicated circuit structure may create crosstalk between the intersecting signal lines, and increase a semiconductor chip area due to additional interconnections.

SUMMARY OF THE INVENTION

The present invention is directed to a multiplexer and a parallel-to-serial converter using the multiplexer, capable of easily controlling a bit sequence of output data without altering an interconnection structure.

One aspect of the present invention provides a multiplexer for controlling a data output sequence, comprising: first and second latches connected with each other in series and sequentially latching a first input data bit in response to each different logic value of a clock signal; third and fourth latches connected with each other in series and sequentially latching a second input data bit in response to each different logic value of the clock signal; first and second clock selectors for selecting the clock signal to drive the first latch and the third latch in response to a selection signal; and a data selector for selecting one of the first and second input data bits latched in each of the second latch and the fourth latch.

Another aspect of the present invention provides a parallel-to-serial converter comprising: an M:1 multiplexer including 2:1 multiplexers arranged in a $\log_2 M$ number of stages in a tree structure and controlling a data output sequence in response to a selection signal; and a clock generator for generating $\log_2 M$ clock signals by sequentially dividing an input clock and driving the 2:1 multiplexers at each stage in response to each of the generated clock signals, wherein the selection signal controls a bit sequence of serial data output from the M:1 multiplexer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

Figure 1A:
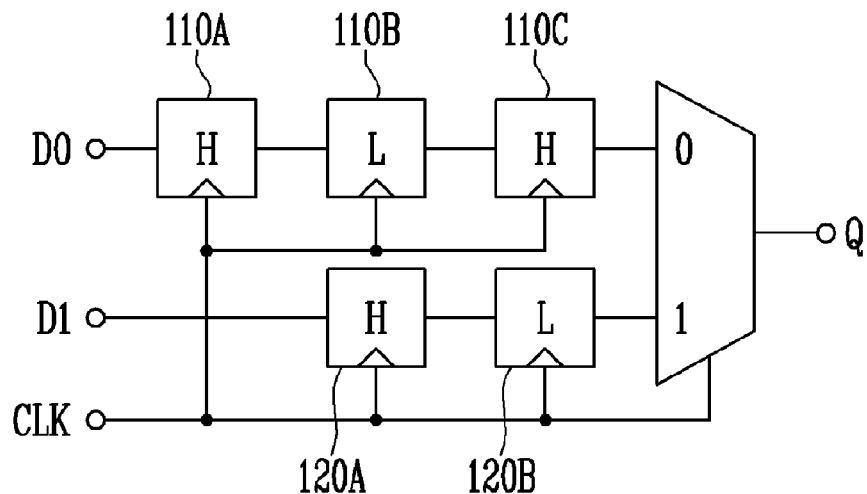
FIGS. 1A and 1B are circuit diagrams of conventional multiplexers.
Figure 1B:
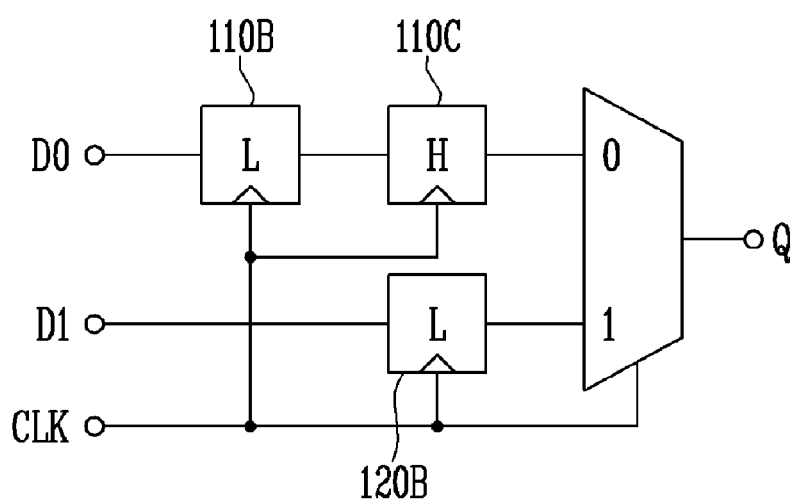
Figure 2A:
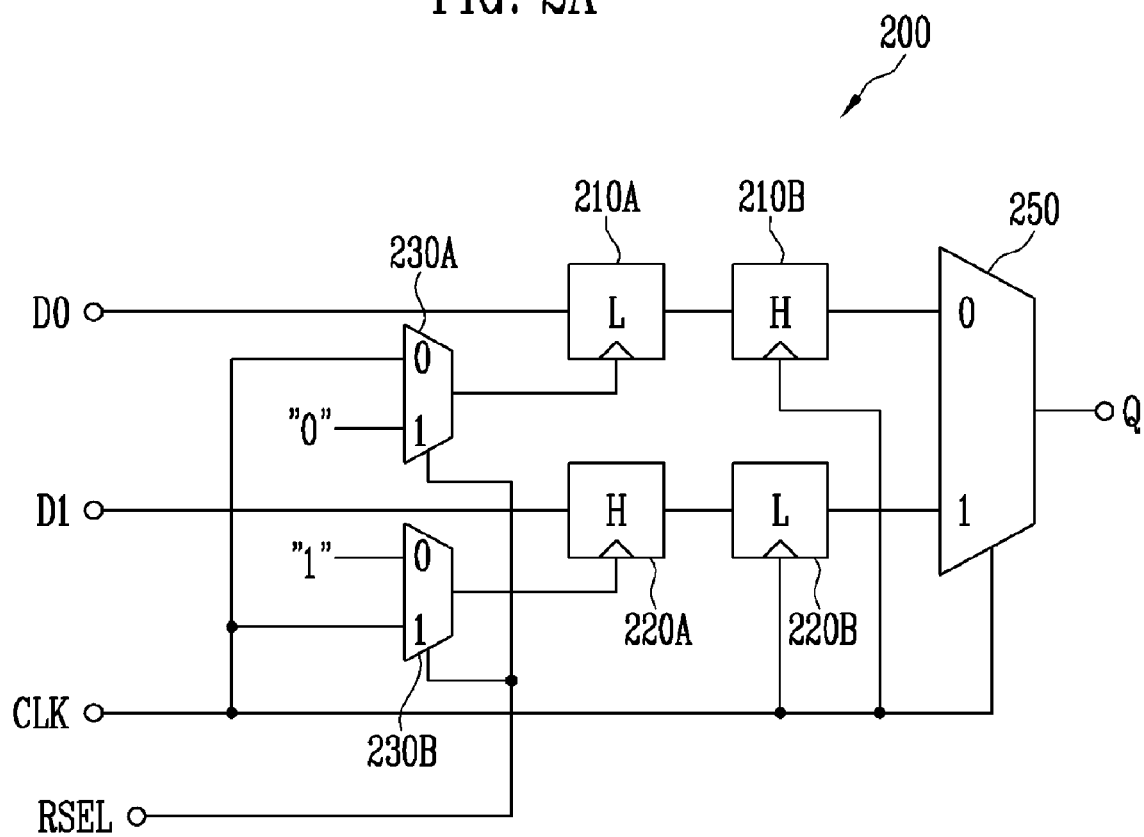
FIG. 2A is a circuit diagram of a multiplexer for controlling a data output sequence in accordance with the present invention.
Figure 2B:
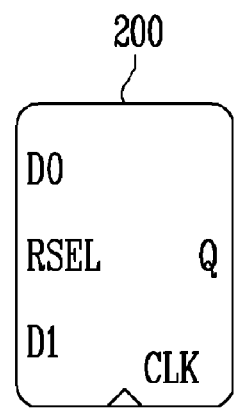
FIG. 2B illustrates the multiplexer of FIG. 2A as a symbol.

FIG. 2A is a circuit diagram of a multiplexer controlling a data output sequence in accordance with the present invention, and FIG. 2B illustrates the multiplexer of FIG. 2A as a symbol.

Referring to FIG. 2A, the multiplexer 200 according to the present invention comprises first and second latches 210A and 210B for sequentially latching a first input data bit D0, third and fourth latches 220A and 220B for sequentially latching a second input data bit D1, first and second clock selectors 230A and 230B for selecting an external clock signal CLK as a clock signal that drives the first and third latches 210A and 220A in compliance with a selection signal RSEL, and a data selector 250 for selecting one of the first and second input data bits D0 and D1 latched in each of the second latch 210B and the fourth latch 220B and outputting the selected input data bit.

Here, it is preferred that the first and second clock selectors 230A and 230B and the data selector 250 are formed of 2:1 multiplexers, each of which selects one of two input data bits in response to respective control signals and outputs the selected input data bit.

Preferably, the first and second latches 210A and 210B and the third and fourth latches 220A and 220B latch and output their input data bits respectively at different logic values of the clock signal CLK.

In detail, the first and fourth latches 210A and 220B directly output the input data bits when the logic value of the clock signal CLK is '0', and cause the input data bits not to affect the output data bit when the logic value of the clock signal CLK is '1'. The second and third latches 210B and 220A directly output the input data bits when the logic value of the clock signal CLK is '1', and cause the input data bits not to affect the output data bit when the logic value of the clock signal CLK is '0'.

The selection signal RSEL is used for selecting which of the first and second input data bits D0 and D1 is first output. A functional feature of the selection signal RSEL will be detailed as follows.

First, when the selection signal RSEL is '0', the first clock selector 230A selects the clock signal CLK between "0" and the clock signal CLK. The selected clock signal CLK is applied to the first latch 210A. Then, the first latch 210A outputs the first input data bit D0 when the clock signal CLK is '0'.

During this process, the second clock selector 230B selects "1" between the clock signal CLK and "1". The selected "1" is applied to the third latch 220A. Then, the third latch 220A operates as a short circuit that directly outputs the second input data bit D1.

That is, when the selection signal RSEL is '0', the first input data bit D0 passes through more one latch than the second input data bit D1 does. Thus, the second input data bit D1 is input to the data selector 250 earlier than the first input data bit D0 at all times, and so is normally selected ahead of the first input data bit D0.

On the other hand, when the selection signal RSEL is '1', the first clock selector 230A outputs "0". The output "0" is applied to the first latch 210A. Then, the first latch 210A operates as a short circuit that directly outputs the first input data bit D0.

During this process, the second clock selector 230B outputs the clock signal CLK. The output clock signal CLK is applied to the third latch 220A. Then, the third latch 220A outputs the second input data bit D1 when the clock signal CLK is '1'.

That is, when the selection signal RSEL is '1', the second input data bit D1 passes through more one latch than the first input data bit D0 does. Thus, the first input data bit D0 is input to the data selector 250 earlier than the second input data bit D1 at all times, and so is normally selected ahead of the second input data bit D1.

As a result, it can be seen that the multiplexer 200 is able to simply control a sequence of selecting the first and second input data bits D0 and D1 in accordance with a logic value of the selection signal RSEL.

The 2:1 multiplexer shown in FIG. 2A may be symbolically represented in FIG. 2B by a block marked with ports of two input data bit D0 and D1, one clock signal CLK, one selection signal RSEL for controlling a data output sequence, and one output signal Q.

Figure 3:
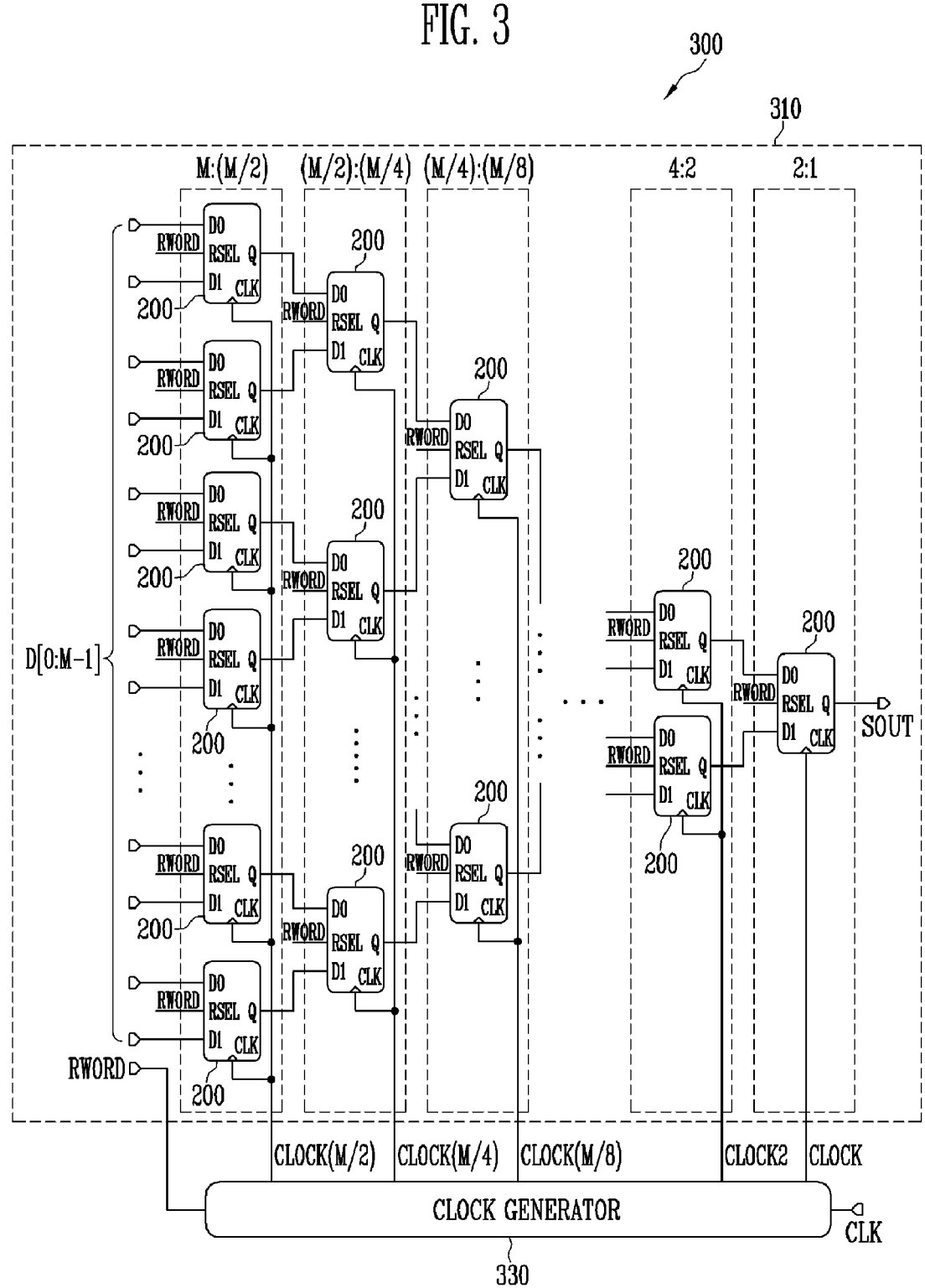
FIG. 3 is a circuit diagram of a parallel-to-serial converter employing the multiplexers according to the present invention.

FIG. 3 is a circuit diagram of a parallel-to-serial converter employing the multiplexers according to the present invention.

Referring to FIG. 3, the parallel-to-serial converter 300 according to the present invention comprises an M:1 multiplexer 310 arranged in a tree structure with the 2:1 multiplexers 200 of FIG. 2B, and a clock generator 330 for providing clocks to drive the M:1 multiplexer 310.

The M:1 multiplexer 310 is composed of a $\log_2 M$ number of stages. The clock generator 330 divides an input clock in sequence twice and generates a $\log_2 M$ number of clock signals. The generated clock signals drive the 2:1 multiplexers 200 at each stage.

The two input data bits of the 2:1 multiplexer 200 of each stage are sampled at different kind of edges of a clock signal CLK in accordance with the logic value of a selection signal RWORD. It is, therefore, imperative to properly align the edges of clock signals from the clock generator 330 in order not to cause an error in a bit sequence of output data.

For that reason, it is preferable for the clock generator 330 to control the divided clock signals to coincide with each other at rising or falling edges in accordance with the logic value of the selection signal RWORD, considering delays of data selection through the 2:1 multiplexers or delays through paths of dividing and distributing the clocks.

In other words, the parallel-to-serial converter 300 is able to arrange a bit sequence of outputting serial data in order from the most significant bit (MSB) to the least significant bit (LSB) or from the least significant bit to the most significant bit, by controlling a bit sequence of output data of the 2:1 multiplexers 200 at each stage in accordance with the selection signal RWORD.

In this way, the parallel-to-serial converter with the multiplexers according to the present invention can easily change an output serial data bit sequence without altering an interconnection structure of parallel data signal lines.

The embodiment of the present invention is implemented such that the first and second clock selectors 230A and 230B operate to select the clock signal for driving the first and third latches 210A and 220A in response to the selection signal RSEL, although the present invention is not restricted thereto. It is also possible to form another configuration such that the first and second clock selectors 230A and 230B operate to select the clock signal for driving the second and fourth latches 210B and 220B in response to the selection signal RSEL. The structure and interconnection feature for driving the second and fourth latches 210B and 220B according to the present invention may be easily understood by those skilled in the art.

As described above, the multiplexer according to the present invention is configured to simply control the output sequence of input data in accordance with a value of a selection signal. Thus, the parallel-to-serial converter with the multiplexer is able to easily control an output bit sequence of serial data without altering an interconnection structure of parallel data signal lines.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A parallel-to-serial converter comprising:
   an M:1 multiplexer including 2:1 multiplexers arranged in a $\log_2 M$ number of stages in a tree structure and controlling a data output sequence in response to a selection signal; and
   a clock generator for generating $\log_2 M$ clock signals by sequentially dividing an input clock and driving the 2:1 multiplexers at each stage in response to each of the generated clock signals,
   wherein the selection signal controls a bit sequence of serial data output from the M:1 multiplexer.

2. The parallel-to-serial converter of claim 1, wherein the clock generator controls the clock signals to coincide at rising or falling edges in response to the selection signal.

3. A multiplexer for controlling a data output sequence, comprising:
   a data selector for selecting and outputting one of first and second input data bits;
   first and second latch blocks each connected to an input terminal of the data selector and preventing the first and second input data bits of the data selector from varying simultaneously; and
   first and second clock selectors for selecting clock signals that drive the first and second latch blocks respectively in response to a selection signal for controlling the data output sequence of the data selector, and outputting the selected clock signals to the first and second latch blocks,
   wherein one of the first and second input data bits arrives at the data selector earlier in response to the selection signal thereby being selected and outputted ahead of the other input data.

4. The multiplexer of claim 3, wherein the first and second latch blocks comprise two or more latches connected in series, and
   any two latches adjacent to each other constituting the first and second latch blocks directly output their respective input data bits at logic values different from each other of their respective clock signal.

5. The multiplexer of claim 4, wherein the two latches, which are directly connected to the input terminals of the data selector, directly output their respective input data bits at logic values different from each other of their respective clock signal, such that the two input data bits of the data selector are not varied simultaneously.

6. The multiplexer of claim 4, further comprising one or more predetermined latches among the latches constituting the first and second latch blocks directly output their respective input data bits regardless of an external input clock signal in response to the clock signals selected by the corresponding clock selectors, and the other latches operate in response to the external input clock signal.

7. The multiplexer of claim 4, wherein the first latch block comprises first and second latches 210A, 210B connected in series and outputting the first input data bit directly at logic values different from each other of their respective clock signal, and
   the second latch block comprises third and fourth latches 220A, 220B connected in series and outputting the second input data bit directly at logic values different from each other of their respective clock signal,
   wherein the first latch and the fourth latch output directly the input data bit when the logic value of the clock signal is '0', and
   wherein the second latch and the third latch output directly the input data bit when the logic value of the clock signal is '1'.

8. The multiplexer of claim 7, wherein, when the selection signal is '0', the first clock selector selects an external input clock signal as the clock signal driving the first latch, and the second clock selector selects "1" as the clock signal driving the third latch.

9. The multiplexer of claim 8, wherein, when the selection signal is '0', the first input data bit is sequentially latched in the first and second latches, and the second input data bit is latched in the fourth latch by way of the third latch.

10. The multiplexer of claim 9, wherein, when the selection signal is '0', the second input data bit arrives at the data selector earlier than the first input data bit and is selected thereby.

11. The multiplexer of claim 7, wherein, when the selection signal is '1', the first clock selector selects "0" as the clock signal to drive the first latch, and the second clock selector selects an external input clock signal as the clock signal to drive the third latch.

12. The multiplexer of claim 11, wherein, when the selection signal is '1', the first input data bit is latched in the second latch by way of the first latch, and the second input data bit is sequentially latched in the third and fourth latches.

13. The multiplexer of claim 12, wherein, when the selection signal is '1', the first input data bit arrives at the data selector earlier than the second input data bit and is selected thereby.

* * * * *